(12) United States Patent
Tripsas et al.

(10) Patent No.: US 7,035,141 B1
(45) Date of Patent: Apr. 25, 2006

(54) DIODE ARRAY ARCHITECTURE FOR ADDRESSING NANOSCALE RESISTIVE MEMORY ARRAYS

(75) Inventors: Nicholas H. Tripsas, San Jose, CA (US); Colin S. Bill, Cupertino, CA (US); Michael A. VanBuskirk, Saratoga, CA (US); Matthew Buynoski, Palo Alto, CA (US); Tzu-Ning Fang, Palo Alto, CA (US); Wei Daisy Cai, Fremont, CA (US); Suzette Pangrle, Cupertino, CA (US); Steven Avanzino, Cupertino, CA (US)

(73) Assignee: Spansion LLC

( * ) Notice: Subject to any disclaimer, the term of this patent is extended or adjusted under 35 U.S.C. 154(b) by 0 days.

(21) Appl. No.: 10/990,706

(22) Filed: Nov. 17, 2004

(51) Int. Cl.
*G11C 11/36* (2006.01)
*G11C 27/00* (2006.01)

(52) U.S. Cl. .................. 365/175; 365/46; 365/148

(58) Field of Classification Search ................. 365/175
See application file for complete search history.

(56) References Cited

U.S. PATENT DOCUMENTS 6,937,528 B1 * 8/2005 Hush et al. ............ 365/189.07

\* cited by examiner

*Primary Examiner*—Amir Zarabian
*Assistant Examiner*—Michael Weinberg

(57) ABSTRACT

The present memory structure includes thereof a first conductor, a second conductor, a resistive memory cell connected to the second conductor, a first diode connected to the resistive memory cell and the first conductor, and oriented in the forward direction from the resistive memory cell to the first conductor, and a second diode connected to the resistive memory cell and the first conductor, in parallel with the first diode, and oriented in the reverse direction from the resistive memory cell to the first conductor. The first and second diodes have different threshold voltages.

5 Claims, 7 Drawing Sheets

DIODE ARRAY ARCHITECTURE FOR ADDRESSING NANOSCALE RESISTIVE MEMORY ARRAYS

BACKGROUND OF THE INVENTION

1. Technical Field

This invention relates generally to memory devices, and more particularly, to a memory array incorporating resistive memory cells.

2. Background Art

Generally, memory devices associated with computers and other electronic devices are employed to store and maintain information for the operation thereof. Typically, such a memory device includes an array of memory cells, wherein each memory cell can be accessed for programming, erasing, and reading thereof. Each memory cell maintains information in an "off" state or an "on" state, also referred to as "0" and "1" respectively, which can be read during the reading step of that memory cell.

As such electronic devices continue to be developed and improved, the amount of information required to be stored and maintained continues to increase. FIG. 1 illustrates a type of memory cell known as a nanoscale resistive memory cell 30, which includes advantageous characteristics for meeting these needs. The memory cell 30 includes, for example, a Cu electrode 32, a superionic layer 34 such as $Cu_2S$ on the electrode 32, an active layer 36 such as $Cu_2O$ or various polymers on the $Cu_2S$ layer 34, and a Ti electrode 38 on the active layer 36. Initially, assuming that the memory cell 30 is unprogrammed, in order to program the memory cell 30, a negative voltage is applied to the electrode 38, while the electrode 32 is held at ground, so that an electrical potential $V_{pg}$ (the "programming" electrical potential) is applied across the memory cell 30 from a higher to a lower potential in the direction from electrode 32 to electrode 38 (see FIG. 2, a plot of memory cell current vs. electrical potential applied across the memory cell 30). This potential is sufficient to cause copper ions to be attracted from the superionic layer 34 toward the electrode 38 and into the active layer 36, causing the active layer 36 (and the overall memory cell 30) to be in a low-resistance or conductive state (A). Upon removal of such potential (B), the copper ions drawn into the active layer 36 during the programming step remain therein, so that the active layer 36 (and memory cell 30) remain in a conductive or low-resistance state.

In order to erase the memory cell (FIG. 2), a positive voltage is applied to the electrode 38, while the electrode 32 is held at ground, so that an electrical potential $V_{er}$ (the "erase" electrical potential) is applied across the memory cell 30 from a higher to a lower electrical potential in the reverse direction. This potential causes current to flow through the memory cell in the reverse direction (C), and is sufficient to cause copper ions to be repelled from the active layer 36 toward the electrode 32 and into the superionic layer 34, in turn causing the active layer 36 (and the overall memory cell 30) to be in a high-resistance or substantially non-conductive state. This state remains upon removal of such potential from the memory cell 30.

FIG. 2 also illustrates the read step of the memory cell 30 in its programmed (conductive) state and in its erased (nonconductive) state. An electrical potential $V_r$ (the "read" electrical potential) is applied across the memory cell 30 from a higher to a lower electrical potential in the same direction as the electrical potential $V_{pg}$. This electrical potential is less than the electrical potential $V_{pg}$ applied across the memory cell 30 for programming (see above). In this situation, if the memory cell 30 is programmed, the memory cell 30 will readily conduct current (level L1), indicating that the memory cell 30 is in its programmed state. If the memory cell 30 is erased, the memory cell 30 will not conduct current (level L2), indicating that the memory cell 30 is in its erased state.

FIGS. 3, 4 and 5 illustrate a memory cell array 40 which incorporates memory cells 30 of the type described above. As illustrated in FIG. 3, the memory cell array 40 includes a first plurality 42 of parallel conductors (bit lines) $BL_0$, $BL_1$, ... $BL_n$, and a second plurality 44 of parallel conductors (word lines) $WL_0$, $WL_1$, ... $WL_n$ overlying and spaced from, orthogonal to, and crossing the first plurality of conductors 42. A plurality of memory cells 30 of the type described above are included, each associated with a select diode 50 having a (forward) threshold $V_t$ and a (reverse) breakdown voltage $V_b$, to form a memory cell-diode structure. Each memory cell 30 is connected in series with a select diode 50 between a conductor BL of the first plurality 42 thereof and a conductor WL of the second plurality 44 thereof at the intersection of those conductors, with the diode 50 oriented in a forward direction from the conductor BL of the first plurality 42 thereof to the conductor WL of the second plurality 44 thereof. For example, as shown in FIG. 3, memory cell $30_{00}$ and diode $50_{00}$ in series connect conductor $BL_0$ of the first plurality of conductors 42 with conductor $WL_0$ of the second plurality of conductors 44 at the intersection of those conductors $BL_0$, $WL_0$, memory cell $30_{10}$ and diode $50_{10}$ in series connect conductor $BL_1$ of the first plurality of conductors 42 with conductor $WL_0$ of the second plurality of conductors 44 at the intersection of those conductors $BL_1$, $WL_0$, etc.

In order to program a selected memory cell (FIG. 3), for example selected memory cell $30_{00}$, the voltage applied to the conductor $BL_0$ is selected as $(V_{pg}+V_t)$ greater than the voltage (0) applied to the conductor $WL_0$, where $V_{pg}$ is as defined above and $V_t$=(forward) threshold voltage of diode $50_{00}$. Additionally, this same voltage $V_{pg}+V_t$ is applied to each of the conductors WL1, ... $WL_n$, and zero voltage is applied to each of the conductors BL1, ... $BL_n$. This results in zero potential being applied across each of the memory cell-diode structures (other than the selected memory cell $30_{00}$ and diode $50_{00}$ structure) connected to the conductor $BL_0$ and the conductor $WL_0$. Each of the other memory cell-diode structures has applied thereacross, from higher to lower potential in the reverse direction of the diode 50, an electrical potential which is equal to $V_{pg}+V_t$. This electrical potential is less than the breakdown voltage $V_b$ of the diode 50, and thus no current flows through the associated memory cell. Thus, the incorporation of the diodes 50 allows one to properly select and program a memory cell, without disturbing any of the other memory cells in the array.

In order to erase a selected memory cell (FIG. 4), for example selected memory cell $30_{00}$, the voltage applied to the conductor $WL_0$ is $(V_{er}+V_b)$ greater than the voltage (0) applied to the conductor $BL_0$, where $V_{er}$ is as defined above and $V_b$=(reverse) breakdown voltage of diode $50_{00}$. Additionally, a voltage of for example $0.5(V_{pg}+V_t)$ is applied to each of the conductors $WL_1$, ... $WL_n$, and each of the conductors BL1, ... $BL_n$. This results a potential of $0.5(V_{pg}+V_t)$ being applied across each of the diode-memory cell structures (other than the selected memory cell $30_{00}$ and diode $50_{00}$ structure) connected to the conductor $BL_0$ and the conductor $WL_0$, from higher to lower potential in the reverse direction of the diode 50. This electrical potential $0.5(V_{pg}+V_t)$ is less than the breakdown voltage $V_b$ of the diode 50, and thus no current will flow through the associated memory cell. Each of the other memory cell-diode structures has applied thereacross an electrical potential of zero. Similar to the above, the incorporation of the diodes 50 allows one to properly select and erase a memory cell, without disturbing any of the other memory cells in the array.

In order to read a selected memory cell (FIG. 5), for example selected memory cell $30_{00}$, the voltage applied to the conductor $BL_0$ is $(V_r+V_t)$ greater than the voltage (0) applied to the conductor $WL_0$, where $V_r$ is as defined above and $V_t$=threshold voltage of diode $50_{00}$). Additionally, a voltage of $V_r+V_t$ is applied to each of the conductors $WL1, \ldots WL_n$, and zero voltage is applied to each of the conductors $BL1, \ldots BL_n$. This results in zero potential applied across each of the memory cell-diode structures (other than the selected memory cell $30_{00}$ and diode $50_{00}$ structure) connected to the conductor $BL_1$ and $WL_0$. Each of the other memory cell-diode structures has applied thereacross, from higher to lower potential in the reverse direction of the diode 50, an electrical potential which is equal to $V_r+V_t$. This potential $V_r+V_t$ is less than the breakdown voltage of the diode 50, so that no current passes through the associated memory cell. Thus, the incorporation of the diodes 50 allows one to properly select and read a memory cell, without disturbing or otherwise influencing any of the other memory cells in the array.

FIG. 6 illustrates ideal (G) and actual (H) voltage-current characteristics for a diode of the type incorporated in the memory array of FIGS. 3–5. It is to be noted that in order to achieve erasing of a selected memory cell, current must be conducted through the selected memory cell, and in order to achieve this conduction of current, the diode associated therewith must be in breakdown. Ideally, such a diode would have a low threshold voltage (forward direction of the diode) on the order of 0.6 volts, and a low breakdown voltage (reverse direction of the diode) on the order of 2.0 volts, as these voltages would readily allow rapid and effective programming, reading, erasing of a selected cell with relatively low electrical potentials applied thereto, so that a low potential power supply can be used.

However, in reality, while a typical diode may indeed have a threshold voltage on then order of 0.6 volts, the breakdown voltage is substantially greater than 2.0 volts (illustrated at in FIG. 6), i.e., for example, 4.5 volts or substantially more. This leads to problems in achieving breakdown of the diode, which is essential in erasing the associated memory cell as described above.

Therefore, what is needed is an approach wherein the ideal characteristics described above are achieved.

DISCLOSURE OF THE INVENTION

Broadly stated, the present memory structure comprises a first conductor, a second conductor, a resistive memory cell connected to the second conductor, a first diode connected to the resistive memory cell and the first conductor, and oriented in the forward direction from the resistive memory cell to the first conductor, and a second diode connected to the resistive memory cell and the first conductor, in parallel with the first diode, and oriented in the reverse direction from the resistive memory cell to the first conductor.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Figure 1:
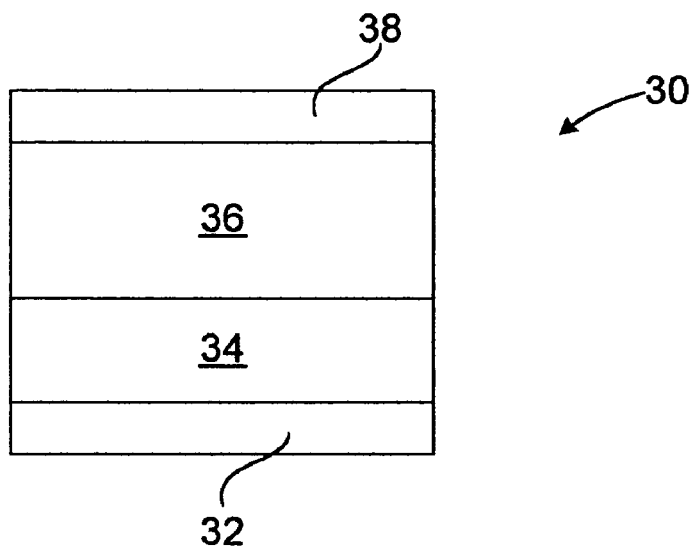
FIG. 1 is a cross-sectional view of a typical resistive memory cell.
Figure 2:
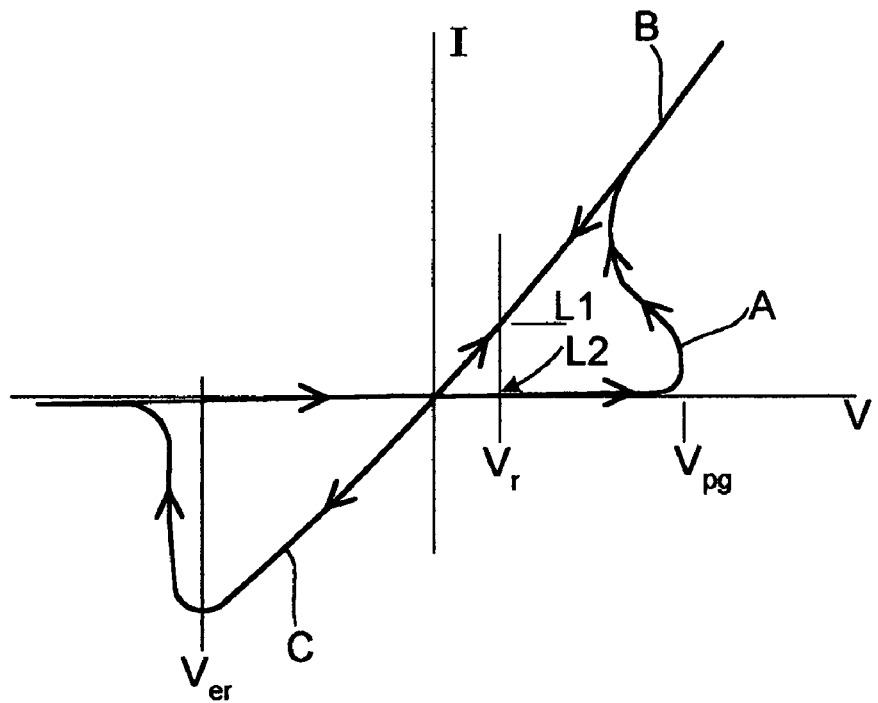
FIG. 2 is a plot of current vs. voltage in the programming, reading and erasing of the memory cell of FIG. 1.
Figure 3:
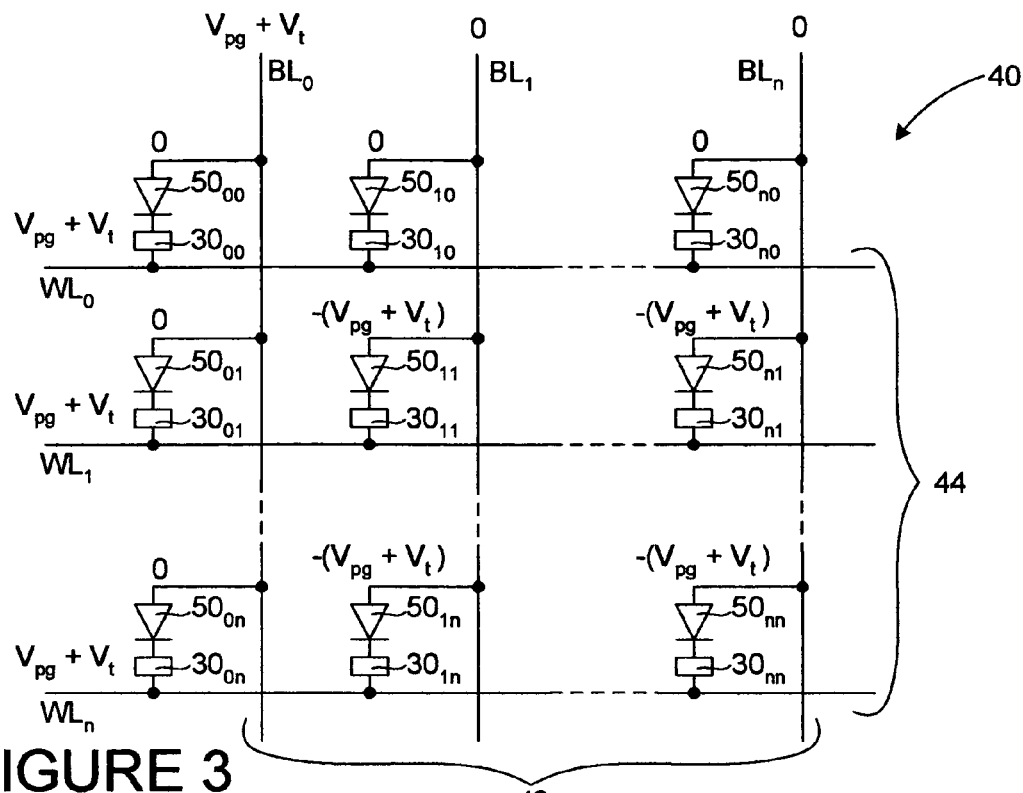
FIG. 3 is a schematic illustration of a memory array which includes memory cells in accordance with FIG. 1, illustrating programming of a selected memory cell.
Figure 4:
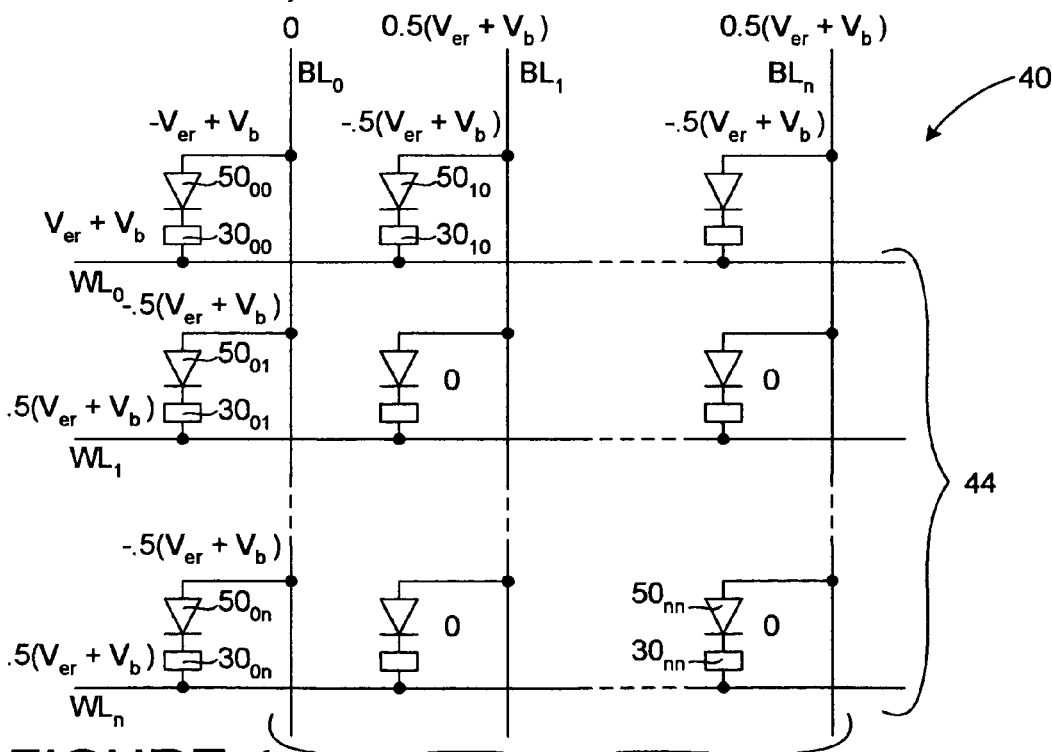
FIG. 4 is a schematic illustration of a memory array which includes memory cells in accordance with FIG. 1, illustrating erasing of a selected memory cell.
Figure 5:
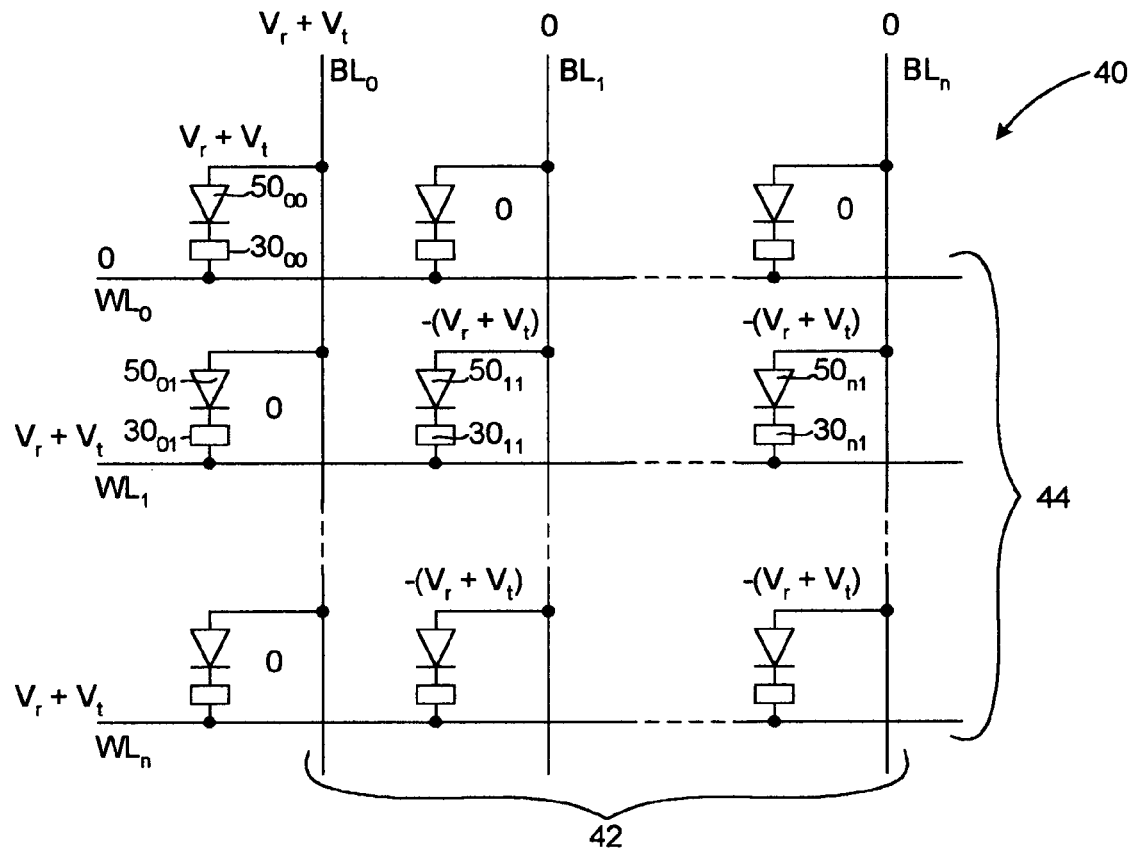
FIG. 5 is a schematic illustration of a memory array which includes memory cells in accordance with FIG. 1, illustrating reading of a selected memory cell.
Figure 6:
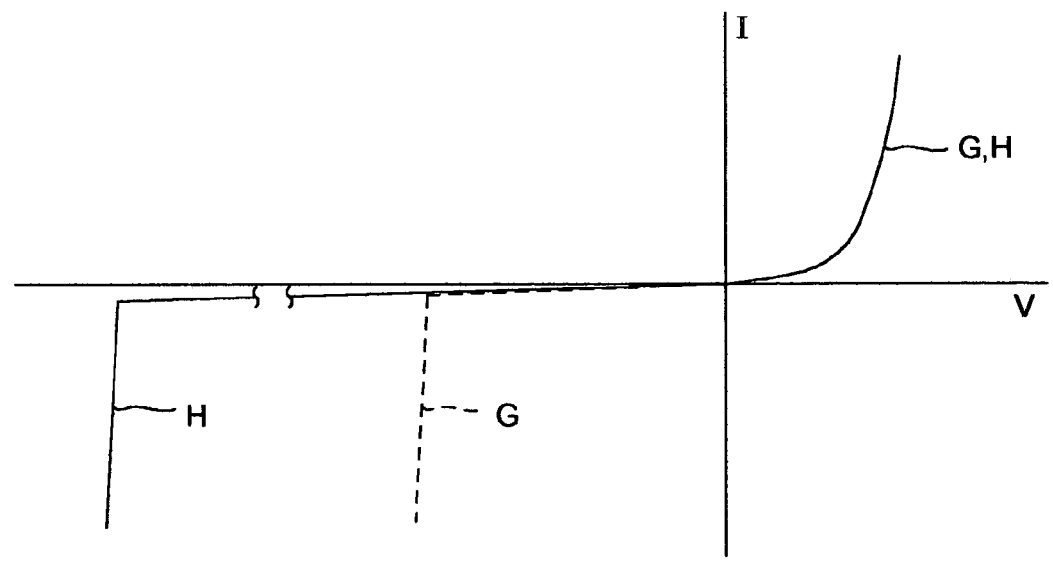
FIG. 6 is a plot of current vs. voltage illustrating diode characteristics.
Figure 7:
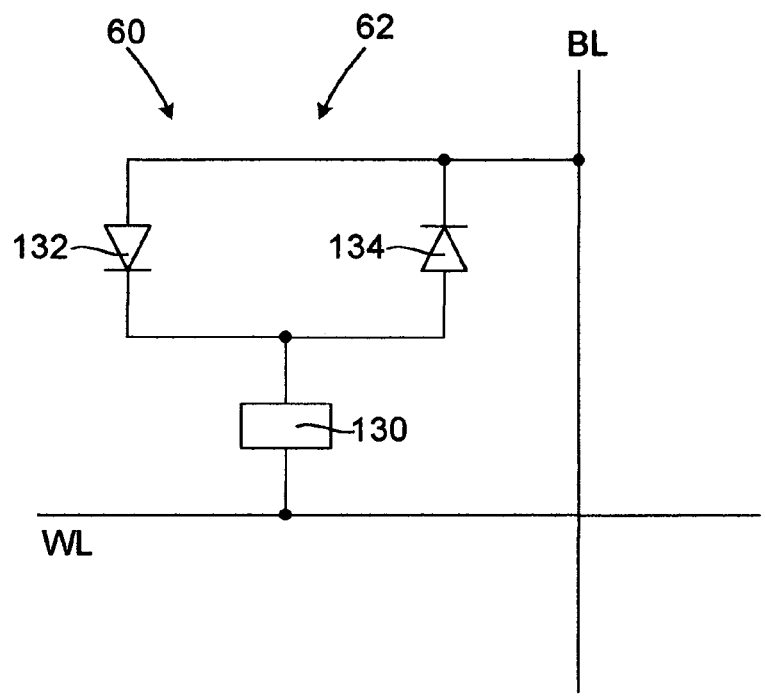
FIG. 7 is a schematic illustration of the first embodiment of the invention.
Figure 8:
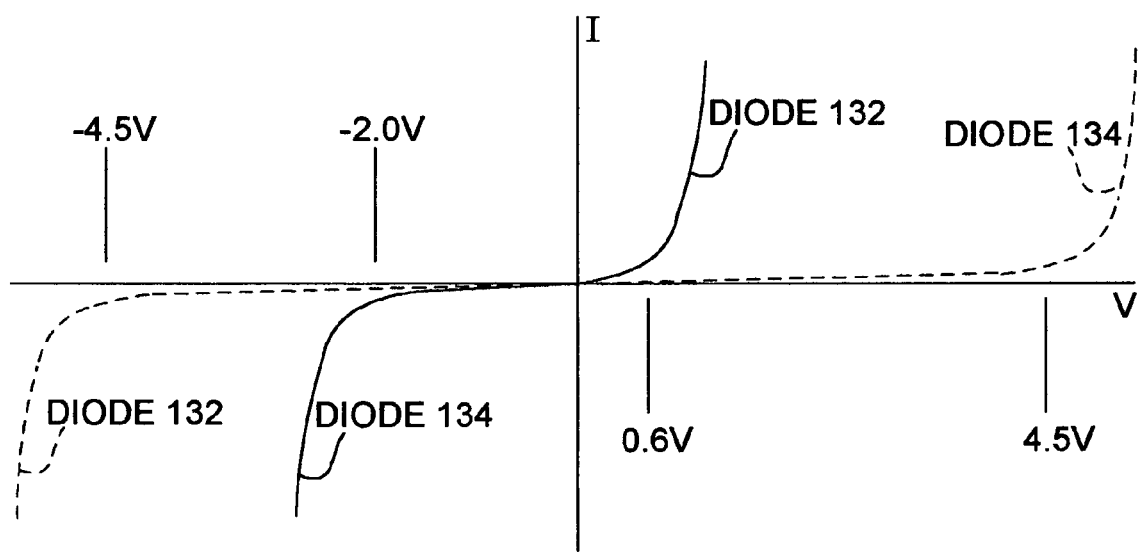
FIG. 8 is a plot of current vs. voltage for the invention of FIG. 7 and the invention of FIG. 10.

FIG. 7 illustrates an embodiment of the present invention. A conductor BL is shown therein, and a conductor WL overlies, crosses and is spaced from the conductor BL. A structure 60 interconnects the conductor BL and the conductor WL at the intersection thereof. The structure 60 includes a resistive memory cell 130, similar to the resistive memory cell 30 above, connected to the conductor WL, a first diode 132 connected to the resistive memory cell 130 and the conductor BL, and a second diode 134 also connected to the resistive memory cell 130 and the conductor BL, in parallel with the first diode 132. The first diode 132 is oriented in the forward direction from the resistive memory cell 130 to the conductor BL, and the second diode 134 is oriented in the reverse direction from the resistive memory cell 130 to the conductor BL. The diodes 132,134 are selected to have different (forward) threshold voltages, for example, diode 132 has threshold voltage $V_{t1}$=0.6 volts, while diode 134 has threshold voltage $V_{t2}$=2.0 volts. Both diodes 132 and 134 have (reverse) breakdown voltages of Vb=4.5 volts as previously described. When considered as a unit, the two diodes in parallel making up the parallel diode structure 62 connected between the resistive memory cell 130 and the conductor BL have the current-voltage characteristic shown in FIG. 8. In the direction from the conductor BL to the resistive memory cell 130, the diode 132 will begin to conduct at its threshold voltage of 0.6 volts, well below the breakdown voltage (4.5 volts) of the diode 134. In the direction from the memory cell 130 to the conductor BL, the diode 134 will begin to conduct at its threshold voltage of 2.0 volts, well below the breakdown voltage (4.5 volts) of the diode 132. The net result is that the parallel diode structure 62 including diodes 132,134 in parallel is substantially the equivalent of a single diode having the characteristics shown in FIG. 8, close to the ideal diode (FIG. 6) as discussed above.

Figure 9:
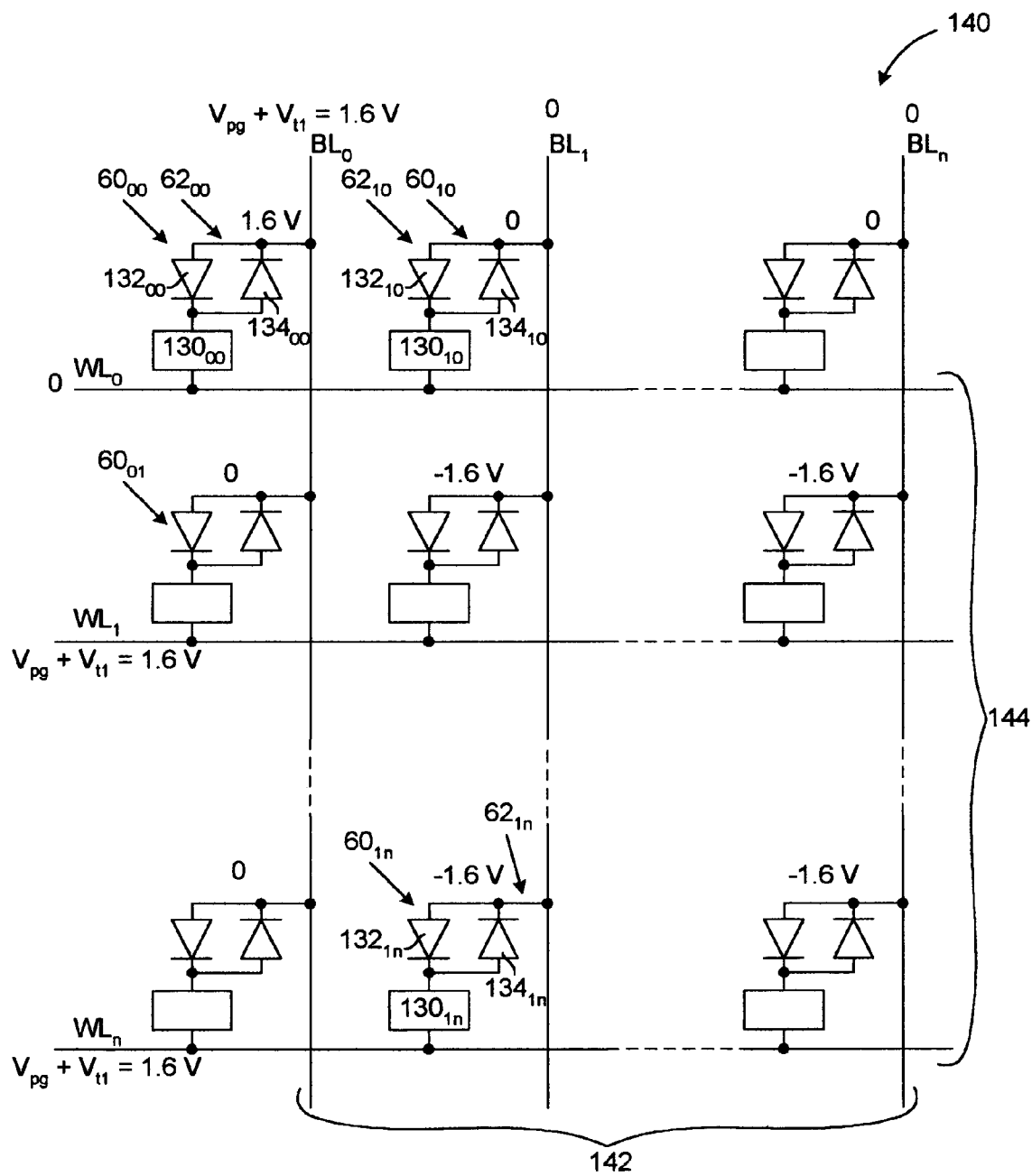
FIG. 9 is a schematic illustration of a memory array incorporating the invention of FIG. 7, illustrating programming of a selected memory cell.
Figure 10:
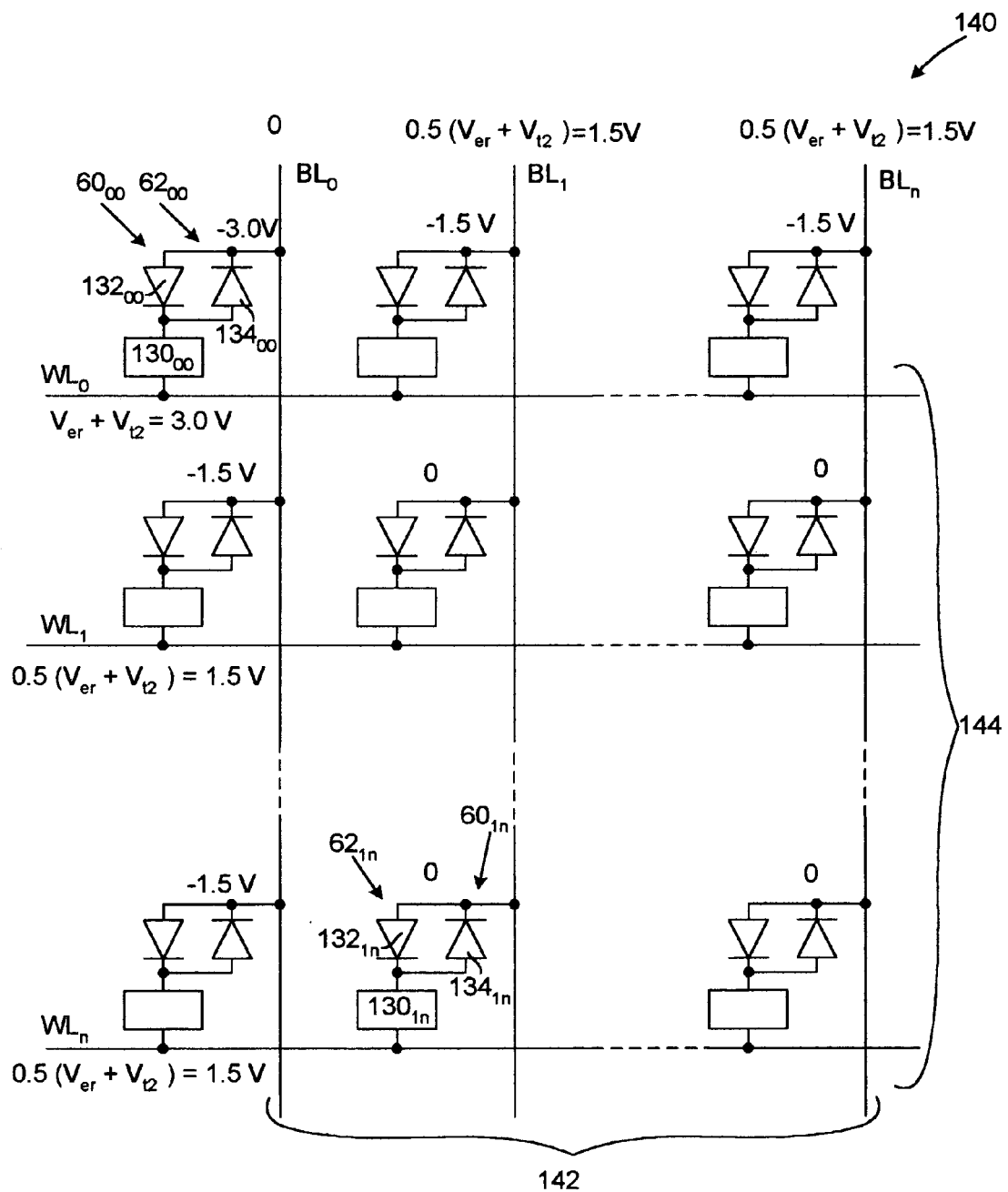
FIG. 10 is a schematic illustration of a memory array incorporating the invention of FIG. 7, illustrating erasing of a selected memory cell.
Figure 11:
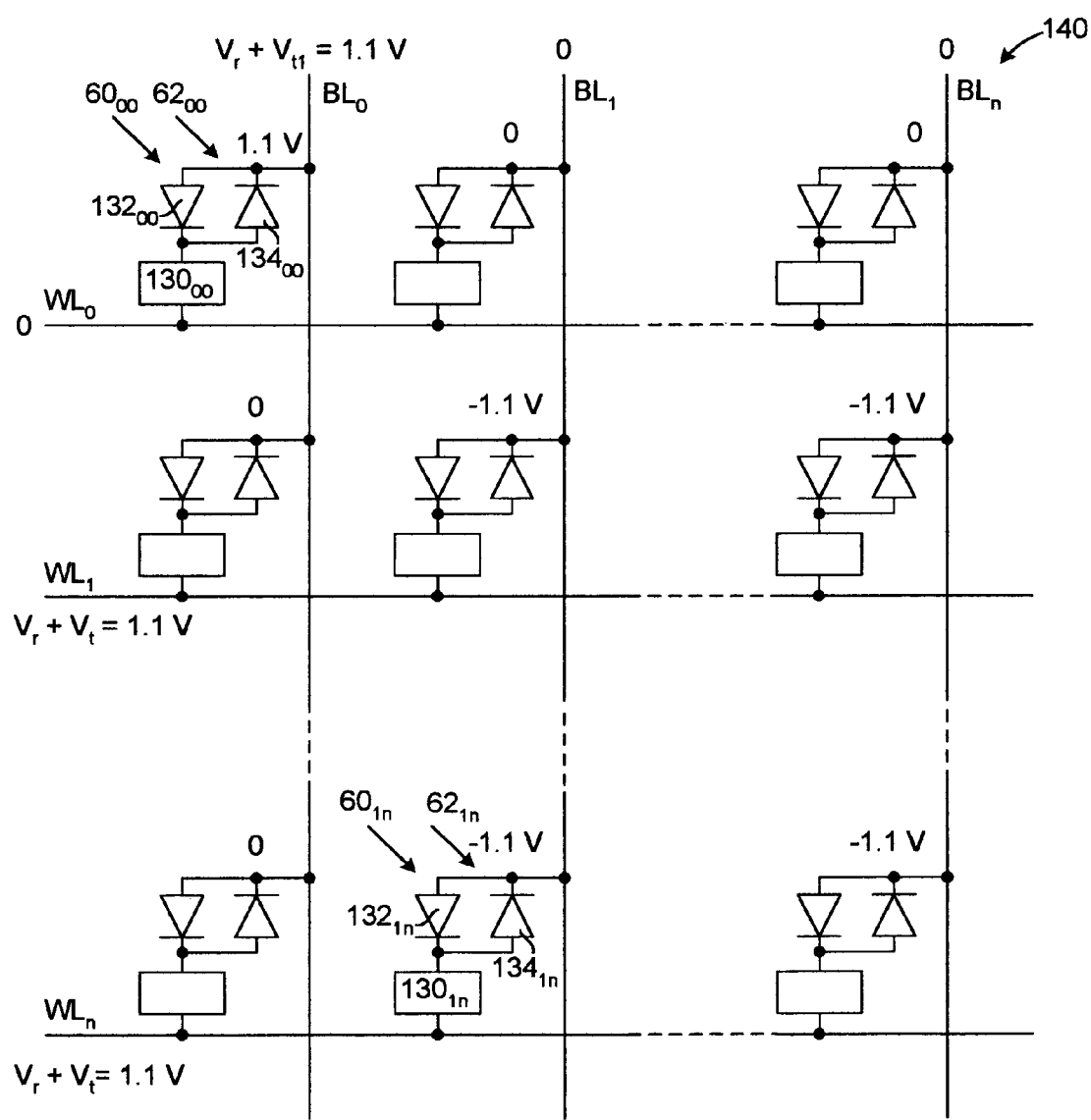
FIG. 11 is a schematic illustration of a memory array incorporating the invention of FIG. 7, illustrating reading of a selected memory cell.

FIGS. 9, 10 and 11 illustrate a memory cell array 140 which incorporates memory cells 130 of the type described above. As illustrated in FIG. 9, the memory cell array 140 includes a first plurality 142 of parallel conductors (bit lines) $BL_0$, $BL_1$, ... $BL_n$, and a second plurality 144 of parallel conductors (word lines) $WL_0$, $WL_1$, ... $WL_n$ overlying and spaced from, orthogonal to, and crossing the first plurality of conductors 142. A plurality of structures 60 as set forth above are included, each connecting a conductor BL with a conductor WL at the intersection thereof. Each structure includes a resistive memory cell 130 and a parallel diode structure 62, connected and configured as described above. For example, as shown in FIG. 9, memory cell $130_{00}$ and parallel diode structure $62_{00}$ in series connect conductor $BL_0$ of the first plurality of conductors 142 with conductor $WL_0$ of the second plurality of conductors 144 at the intersection of those conductors $BL_0$, $WL_0$, memory cell $130_{10}$ and parallel diode structure $62_{10}$ in series connect conductor $BL_1$ of the first plurality of conductors 142 with conductor $WL_0$ of the second plurality of conductors 144 at the intersection of those conductors $BL_1$, $WL_0$, etc.

In order to program a selected memory cell (FIG. 9), for example selected memory cell $130_{00}$, the voltage applied to the conductor $BL_0$ is selected as $(V_{pg}+V_{t1})$ greater than the voltage (0) applied to the conductor $WL_0$, where $V_{pg}$, as defined above, is in this embodiment 1.0 volts, and $V_{t1}$, (forward) threshold voltage of diode=0.6 volts, so that $V_{pg}+V_{pg+Vt1}$=1.6 volts. Additionally, this same voltage $V_{pg}+V_{t1}$ of 1.6 volts is applied to each of the conductors $WL_1$, ... $WL_n$, and zero voltage is applied to each of the conductors $BL_1$, ... $BL_n$. This results in zero potential being applied across each of the structures 60 (other than the structure $60_{00}$) connected to the conductor $BL_0$ and the conductor $WL_0$. Each of the other structures 60 in the array 140 has applied thereacross, from higher to lower potential in the direction from conductor WL to conductor BL, an electrical potential which is equal to $V_{pg}+V_{t1}$=1.6 volts. This electrical potential is less than the threshold voltage $V_{t2}$ (2 volts) of the diode 134 (and less than the breakdown voltage $V_b$, 4.5 volts, of the diode 132), and thus no current flows through the associated memory cells 130. Thus, the incorporation of the diode structure 60 allows one to properly select and program a memory cell, without disturbing or otherwise influencing any of the other memory cells in the array.

In order to erase a selected memory cell (FIG. 10), for example selected memory cell $130_{00}$, the voltage applied to the conductor $WL_0$ is $(V_{er}+V_{t2})$ greater than the voltage (0) applied to the conductor $BL_0$, where $V_{er}$ is as defined above and is in this embodiment 1.0 volts, and $V_{t2}$, the threshold voltage of the diode, is 2.0 volts, so that $V_{er}+V_{t2}$=3.0 volts. Additionally, a voltage of for example $0.5(V_{pg}+V_{t2})$=1.5 volts is applied to each of the conductors $WL_1$, ... $WL_n$, and each of the conductors $BL_1$, ... $BL_n$. This results in a potential of 1.5 volts being applied across each of the structures 60 (other than the structure $60_{00}$) connected to the conductor $BL_0$ and the conductor $WL_0$, from higher to lower potential in the direction from conductor WL to conductor BL. This electrical potential of 1.5 volts is less than the threshold voltage $V_{t2}$ (2.0 volts) of the diode 134 (and less than the breakdown voltage $V_b$, 4.5 volts, of the diode 132), and thus no current will flow through the other memory cells 130 associated with conductor $BL_0$ and conductor $WL_0$. Each of the other structures 60 in the array 140 has applied thereacross an electrical potential of zero. Similar to the above, the incorporation of the diode structure 62 allows one to properly select and erase a memory cell, without disturbing any of the other memory cells in the array.

In order to read a selected memory cell (FIG. 11), for example selected memory cell $130_{00}$, the voltage applied to the conductor $BL_0$ is $(V_r+V_{t1})$ greater than the voltage (0) applied to the conductor $WL_0$, where $V_r$ is as defined above and in this example equals 0.5 volts and $V_{t1}$=threshold voltage of diode $132_{00}$, i.e., 0.6 volts, so that $V_r+V_{t1}$=1.1 volts. Additionally, a voltage of $V_r+V_{t1}$=1.1 volts is applied to each of the conductors $WL_1$, ... $WL_n$, and zero voltage is applied to each of the conductors $BL1$, ... $BL_n$. This results in zero potential applied across each of the structures 60 (other than the structure $60_{00}$) connected to the conductor $BL_1$ and $WL_0$. Each of the other structures 60 of the array has applied thereacross, from higher to lower potential in the direction from conductor WL to conductor BL, an electrical potential which is equal to $V_r+V_{t1}$. This potential $V_r+V_{t1}$=1.1 volts is less than the threshold voltage Vt2 (2.0 volts) of the diode 134 (and is less than the breakdown voltage of the diode 132, 4.5 volts), so that no current passes through the associated memory cell 130. Thus, the incorporation of the diode structure 62 allows one to properly select and read a memory cell, without disturbing any of the other memory cells in the array.

It will be seen that a highly efficient and effective approach for programming, erasing and reading resistive memory cells is provided. Of particular importance is the achievement of a diode structure which incorporates an ideal characteristic for threshold voltage and breakdown voltage thereof.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A memory structure comprising:
   a first conductor,
   a second conductor;

a resistive memory cell connected to the second conductor;

a first diode connected to the resistive memory cell and the first conductor, and oriented in the forward direction from the resistive memory cell to the first conductor; and a second diode connected to the resistive memory cell and the first conductor, in parallel with the first diode, and oriented in the reverse direction from the resistive memory cell to the first conductor;

wherein the first and second diodes have different threshold voltages.

2. A memory structure comprising:

a first conductor;

a second conductor;

a memory cell connected to the second conductor;

a first diode connected to the memory cell and the first conductor; and a second diode connected to the memory cell and the first conductor, in parallel with the first diode;

wherein the first and second diodes have different threshold voltages.

3. The memory structure of claim 2 wherein the first diode is oriented in the forward direction from the memory cell to the first conductor, and the second diode is oriented in the reverse direction from the memory cell to the first conductor.

4. The memory structure of claim 2 wherein the memory cell is a resistive memory cell.

5. A memory array comprising;

a first plurality of conductors;

a second plurality of conductors, and;

a plurality of memory structures, each connecting a conductor of the first plurality thereof with a conductor of the second plurality thereof, each memory structure comprising;

a resistive memory cell connected to a conductor of the second plurality thereof;

a first diode connected to the resistive memory cell and a conductor of the first plurality thereof, and oriented in the forward direction from the resistive memory cell to the conductor of the first plurality thereof; and a second diode connected to the resistive memory cell and the conductor of the first plurality thereof, in parallel with the first diode, and oriented in the reverse direction from the resistive memory cell to the conductor of the first plurality thereof;

wherein the first and second diodes have different threshold voltages.

* * * * *